United States Patent
Ueda

(10) Patent No.: US 6,562,721 B2
(45) Date of Patent: May 13, 2003

(54) DRY ETCHING METHOD AND METHOD OF MANUFACTURING SEMICONDUCTOR DEVICE

(75) Inventor: Yasuhiko Ueda, Tokyo (JP)

(73) Assignee: NEC Electronics Corporation, Kawasaki (JP)

( * ) Notice: Subject to any disclaimer, the term of this patent is extended or adjusted under 35 U.S.C. 154(b) by 0 days.

(21) Appl. No.: 09/754,638

(22) Filed: Jan. 4, 2001

(65) Prior Publication Data

US 2001/0016422 A1 Aug. 23, 2001

(30) Foreign Application Priority Data

Jan. 26, 2000 (JP) .................................. 2000-017685

(51) Int. Cl.$^7$ ............................................. H01L 21/302
(52) U.S. Cl. ................... 438/706; 438/709; 438/714; 438/723; 438/724; 438/725
(58) Field of Search ............................. 438/706, 709, 438/714, 723, 724, 725, 743

(56) References Cited

U.S. PATENT DOCUMENTS 4,581,101 A * 4/1986 Senoue et al. ............. 438/706
5,286,344 A * 2/1994 Blalock et al. ............. 438/723
5,960,270 A * 9/1999 Misra et al. ................ 438/197
5,994,227 A * 11/1999 Matsuo et al. ............. 438/696
6,277,716 B1 * 8/2001 Chhagan et al. ........... 438/584
6,346,482 B2 * 2/2002 Matsumoto et al. ........ 438/706

* cited by examiner

*Primary Examiner*—Benjamin L. Utech
*Assistant Examiner*—Binh X. Tran
(74) *Attorney, Agent, or Firm*—Katten Muchin Zavis Rosenman

(57) ABSTRACT

There is provided a dry etching method for forming an insulating layer of $SiO_2$ or the like in a desired shape with a substantially infinite selection property with respect to $Si_3N_4$ used as an etching stopper. As an etching gas a gas (HI, or a gas having a constitution of $C_xH_yI_z$) containing iodine in a molecule is added. Here, a mixing ratio (I/C) of iodine to carbon in the etching gas is $0.3 \leq (I/C) \leq 1.5$. Alternatively, instead of the iodine-containing gas the gas containing chlorine or bromine as the same halogen element is used. Since iodine, chlorine, or bromine contained in the etching gas generates a low vapor pressure material on $Si_3N_4$, $Si_3N_4$ etching is completely prohibited. Since no low vapor pressure material is generated on $SiO_2$ or SiOF as a material to be etched, a high etching rate can be obtained.

6 Claims, 3 Drawing Sheets

BEFORE PLASMA ETCHING

AFTER PLASMA ETCHING

BEFORE PLASMA ETCHING

AFTER PLASMA ETCHING

DRY ETCHING METHOD AND METHOD OF MANUFACTURING SEMICONDUCTOR DEVICE

BACKGROUND OF THE INVENTION

1. Field of the Invention

The present invention relates to a dry etching method and method of manufacturing a semiconductor device, and more particularly to a dry etching method for forming a semiconductor device structure on a semiconductor wafer.

2. Description of the Related Art

In a semiconductor device, a silicon oxide (hereinafter referred to $SiO_2$) layer is widely used as an interlayer layer where a contact hole (via hole), a wiring groove, and the like is formed by a dry etching process.

In the dry etching process, as a etching stopper film (film for selectively stopping the progress of etching in a position thereof) used for an etching depth to be uniform, a silicon nitride (hereinafter referred to $Si_3N_4$) film is most frequently used. This is because the film is the most superior film as the etching stopper film of the insulating layer in view of stability as the film, compatibility with the $SiO_2$ layer, heat resistance, insulating property, and other general properties.

Moreover, a gas for general use in $SiO_2$ etching at present is a gas mainly comprising $C_xF_y$ (x and y are positive integers). In addition, argon (Ar), oxygen ($O_2$), carbon monoxide (CO) and the like may be added to this main gas as occasion demands.

As described above, $Si_3N_4$ is most frequently used as the etching stopper of the insulating layer, but sufficiently high selection property can not be obtained in an $SiO_2$ etching process which is generally performed at present.

There are two reasons for this with regard to a semiconductor device structure. The first reason is that the contact hole used in recent years is remarkably high in aspect ratio, a deposition component does not easily enter a hole bottom part, and sufficient protection effect is not obtained. The second reason is that $Si_3N_4$ has the insulating property, but dielectric constant of $Si_3N_4$ is higher than that of $SiO_2$, and therefore, $Si_3N_4$ remaining outside the contact hole as a part of the insulating layer must be as thin as possible (about 50 nm). Consequently, the film thickness of the $Si_3N_4$ as a etching stopper film becomes inevitably thin as about 50 nm, and therefore, the required selection property is a remarkably high value such as the order of 50 to 100. By these reasons, as a selection ratio to $Si_3N_4$ in insulation layer etching, a substantially infinite selection ratio is required, but it is remarkably difficult to achieve the ratio in a current etching method.

A reason why the high selection property cannot be obtained with respect to $Si_3N_4$ in the conventional etching method in which the $C_xF_y$ gas is used as the main gas is as follows. When an active species of the gas contacts $Si_3N_4$, first C extracts N on a surface, F attacks freed Si and the etching supposedly proceeds in this pattern. Since both $(CN)x$ and $SiF_4$ are high vapor pressure materials, on occurrence of a reaction the etching proceeds.

SUMMARY OF THE INVENTION

Wherefore, one object of the present invention is to provide an effective dry etching method, which solves the aforementioned related-art problems.

Another object of the present invention is to provide a method of manufacturing a semiconductor device using the effective dry etching method.

According to the present invention, there is provided a dry etching method which comprises a step of etching an insulating layer of a semiconductor device structure using a silicon nitride represented by $Si_3N_4$ as an etching stopper under an etching gas atmosphere. The etching gas includes a gas containing iodine in a molecule. The insulating layer may be a silicon oxide represented by $SiO_2$ layer, a fluorine-containing silicon oxide layer, or an organic SOG layer or another silicon oxide insulating layer. Additionally, a mixing ratio (I/C) of iodine to carbon in the etching gas, that is, a ratio of number (quantity) of iodine atoms to number (quantity) of carbon atoms in the etching gas is $0.3 \leq (I/C) \leq 1.5$, that is, the ratio (I/C) is 0.3 or more, and 1.5 or less. Here, the iodine-containing gas can be an HI gas or a gas having a constitution of $C_xH_yI_z$ (x, y and z are positive integers).

According to another aspect of the present invention, there is provided a dry etching method which comprises a step of etching an insulating layer of a semiconductor device structure using a silicon nitride film represented by $Si_3N_4$ as an etching stopper under an etching gas atmosphere. The etching gas includes a gas containing chlorine or bromine in a molecule. The insulating layer may be a silicon oxide represented by $SiO_2$ layer, a fluorine-containing silicon oxide layer, or an organic SOG layer or another silicon oxide insulating layer. Additionally, a mixing ratio (Cl (or Br)/C) of chlorine or bromine to carbon in the etching gas is $0.3 \leq (Cl\ (or\ Br)/C) \leq 1.5$. That is, a ratio of number (quantity) of chlorine atoms or bromine atoms to number (quantity) of carbon atoms in the etching gas is 0.3 or more, and 1.5 or less. Here, the gas containing chlorine or bromine can be a $Cl_2$ gas, an HCl gas, a gas having a constitution of $C_xH_yCl_z$ (x, y and z are positive integers), a gas having a constitution of $C_xCl_z$ (x, and z are positive integers), for example, $CCl_4$, a $Br_2$ gas, an HBr gas, or a gas having a constitution of $C_xH_yBr_z$ (x, y and z are positive integers)

According to further aspect of the present invention, there is provided a method of manufacturing a semiconductor device which comprises steps of forming a wiring layer on a semiconductor substrate via an insulator, forming a silicon nitride film represented by $Si_3N_4$ on the wiring layer, forming an insulating layer on the silicon nitride film, and forming a contact hole in the insulating layer by a dry etching method. The dry etching method includes a step of etching the insulating layer by using the silicon nitride film as an etching stopper under an etching gas atmosphere. The etching gas includes a gas containing iodine, chlorine or bromine in a molecule, and a mixing ratio ((I, Cl or Br)/C) of iodine, chlorine or bromine to carbon in the etching gas is 0.3 or more, and 1.5 or less.

According to yet further aspect of the present invention, there is provided a method of manufacturing a semiconductor device which comprises steps of forming a pair of gate electrode structures on a semiconductor substrate via gate insulating films, covering the gate electrode structures and a space between the gate electrode structures with a silicon nitride film represented by $Si_3N_4$ continuously, forming an insulating layer on the silicon nitride film, and forming a contact hole in the insulating layer between the gate electrode structures by a dry etching method. The dry etching method includes a step of etching the insulating layer by using the silicon nitride represented by $Si_3N_4$ film as an etching stopper under an etching gas atmosphere. The etching gas includes a gas containing iodine, chlorine or bromine in a molecule, and a mixing ratio ((I, Cl or Br)/C) of iodine, chlorine or bromine to carbon in the etching gas is 0.3 or more, and 1.5 or less.

Furthermore, the aforementioned etching method is preferably used when a contact hole with an aspect ratio of 20 or less is formed in the insulating layer.

In this case, etching is performed by the etching gas from the surface of the insulating layer to reach $Si_3N_4$ so that the contact hole can be formed in the insulating layer. Alternatively, in a two-step etching method which comprises performing etching from the surface of the insulating layer with a first etching gas to form an upper part of the contact hole, and subsequently performing the etching with a second etching gas until $Si_3N_4$ is reached to form a lower part of the contact hole; the aforementioned etching gas including iodine, chlorine or bromine can be used as the second etching gas.

According to the dry etching method of the present invention, iodine contained in the etching gas forms CNI, which is a low vapor pressure material on $Si_3N_4$, and inhibits the etching of the $Si_3N_4$. Also, when the chlorine or bromine-containing gas is used, CNCl or CNBr, that is, a relatively low vapor pressure material is formed to inhibit the etching of the $Si_3N_4$.

In either case, since no low vapor pressure material is generated on $SiO_2$ as the material to be etched, SiOF whose dielectric constant is lowered by containing fluorine in silicon oxide, or organic SOG, a high etching rate can be obtained.

Moreover, when a CxHyFz (x, y and z are positive integers) gas used in recent years is added, $NH_3$ with a higher vapor pressure is generated, and it is therefore difficult to keep a high selection property with respect to $Si_3N_4$. However, even in this case, when an iodine-containing gas is used, $NH_4I$ with a low vapor pressure is formed to inhibit the etching of the $Si_3N_4$ film.

The reason why the ratio (I/C) of iodine to carbon in the etching gas is set in a range of $0.3 \leq (I/C) \leq 1.5$ is that an effect of the range includes dependence on an aspect ratio, and with a larger aspect ratio the I/C ratio needs to be set to be high. Specifically, according to various experiments/inspections by the present inventors, when flat and large patterns such as a pad pattern are etched, a sufficient etching inhibition effect is obtained at I/C=0.3. However, in order to obtain a sufficient etching inhibition effect in $Si_3N_4$ in a contact hole bottom part with an aspect ratio of 20 (e.g., hole diameter of 0.15 μm/depth of 3.0 μm), which is a largest aspect ratio in a presently used semiconductor device, I/C=1.5 is necessary. Moreover, it has been confirmed by the experiments that the etching inhibition effect depends on the aspect ratio rather than on the hole diameter. This respect will be described in an embodiment.

Furthermore, it has been confirmed that even when instead of the iodine-containing gas the gas containing chlorine or bromine as the same halogen element is used, the similar action/effect can be produced.

BRIEF DESCRIPTION OF THE DRAWINGS

FIG. 1 shows diagrams of a first embodiment of the present invention.

FIG. 2 shows diagrams of a second embodiment of the present invention.

FIG. 3 shows diagrams of a third embodiment of the present invention.

DETAILED DESCRIPTION OF THE PREFERRED EMBODIMENTS

Embodiments of the present invention will next be described with reference to the drawings.

Figure 1A:
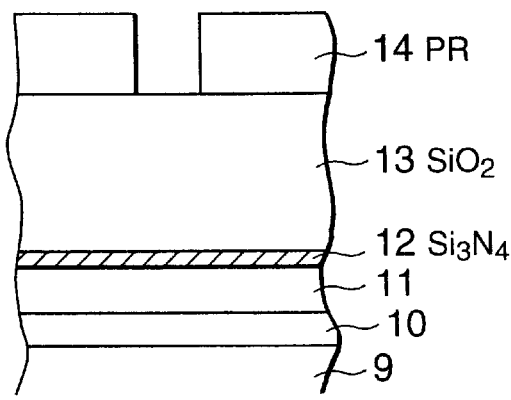
FIG. 1A is a sectional view of a sample structure.

A sectional view of a sample of a first embodiment is shown in FIG. 1A. Specifically, FIG. 1A shows the sample constituted of forming $Si_3N_4$ 12 and $SiO_2$ 13 in sequence on an underlying wiring layer 11 formed on an insulator 10 such as a field oxide layer provided on a major surface on a semiconductor substrate 9, and using a pattern of a photoresist (PR) 14 as a mask and $Si_3N_4$ 12 as an etching stopper to subject $SiO_2$ 13 to a dry etching which is an anisotropic etching, in order to form a contact hole reaching the underlying wiring layer.

A film thickness of PR is 700 nm (nano-meter), film thickness of $SiO_2$ is 1500 nm, and film thickness of $Si_3N_4$ is 50 nm.

A process gas I/C ratio and $Si_3N_4$ etching rate during dry etching using this sample were investigated. In the sample, since resolution to a hole-diameter of 0.3 μm is achieved by KrF exposure, the aspect ratio after the etching is 5.

Figure 1B:
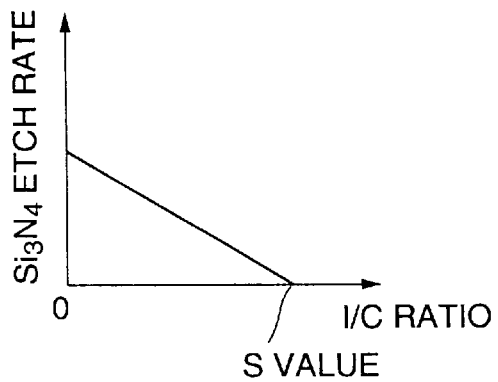
FIG. 1B is a chart showing a relation between an I/C ratio and an $Si_3N_4$ etching rate.

In a case of changing the process gas I/C ratio and measuring the $Si_3N_4$ etching rate of the hole bottom part, when the I/C ratio was increased, the $Si_3N_4$ etching rate of the hole bottom part was lowered. In the present structure, the etching did not proceed at all at the I/C ratio of 0.65. A relation between the process gas I/C ratio and the $Si_3N_4$ etching rate is shown in FIG. 1B. Here, an I/C ratio at which the $Si_3N_4$ etching rate of the hole-bottom part becomes zero (0) is defined as an S value.

Figure 1C:
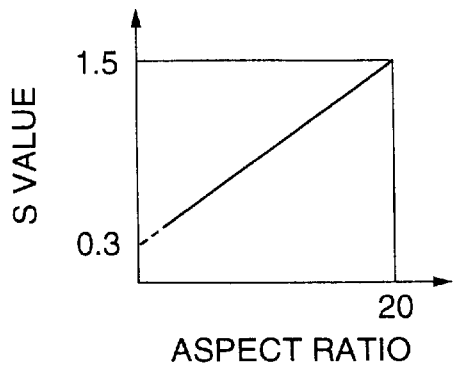
FIG. 1C is a chart showing a relation between an aspect ratio and an S value.

By variously changing the $SiO_2$ film thickness and hole diameter and checking a relation between the aspect ratio and the S value, as shown in FIG. 1C, it has been found that there is a substantially directly proportional relation (S value=0.06×aspect ratio+0.3). Here, since the aspect ratio substantially necessary in the semiconductor device is 20 or less, it has been found that the I/C ratio effective for a high selection etching to $Si_3N_4$ is in a range of 0.3 to 1.5.

Figure 2A:
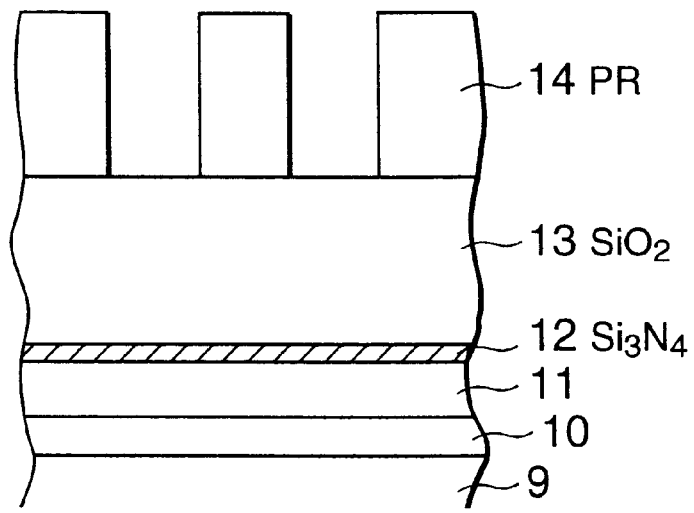
FIG. 2A is a sectional view before plasma etching.

A second embodiment of the present invention will next be described with reference to FIG. 2. There is shown a case in which a 0.3 μm wide groove for groove wiring is formed by PR (resist mask) 14. A shape before the etching is shown in FIG. 2A.

For the etching stopper, $Si_3N_4$ with a film thickness of 50 nm was formed, and $SiO_2$ with a film thickness of 1500 nm was formed on the stopper as an interlayer.

The photoresist mask (PR) was provided with a film thickness of 700 nm, and the resolution to a width of 0.3 μm was achieved by KrF exposure. The photoresist was subjected to a heat treatment of 120° C. by baking after a development treatment.

An apparatus for use in anisotropic etching was a general parallel flat plate RIE apparatus, and etching conditions were $C_4F_8$/CO/Ar/HI=30/70/300/120 (sccm), pressure of 20 mTorr, and stage temperature of 20° C. The I/C ratio in these conditions is 0.63. According to the present conditions, $SiO_2$ etching rate: 620 nm/min, and $SiO_2$/PR selection ratio is 12.

By setting an over etch amount to 50% with respect to the $SiO_2$ film thickness, an etching time was set.

Figure 2B:
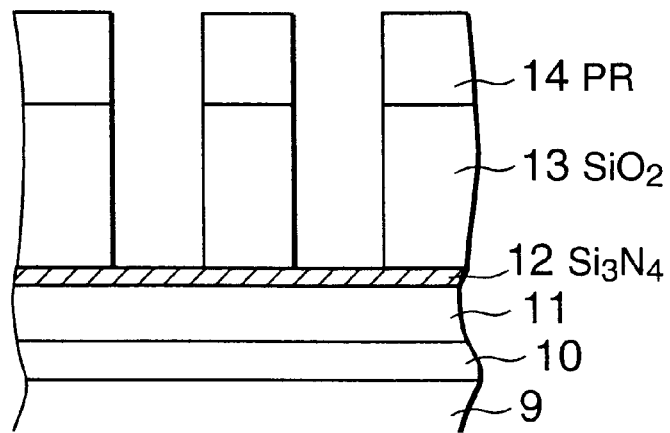
FIG. 2B is a sectional view after the plasma etching.

A schematic view of an etched shape is shown in FIG. 2B. No shave of $Si_3N_4$ of the hole bottom part was confirmed, and deposition of 18 nm was found. Even by setting the over etch amount to 100% and setting the etching time, only a deposited film thickness increased, and no shave of $Si_3N_4$ of the hole bottom part was confirmed. Moreover, a critical dimension (CD) difference indicating a dimension change amount after the etching was satisfactory within ±4 nm.

Additionally, thereafter, by removing the part of $Si_3N_4$ 12 exposed to the bottom part by wet etching or the like, the contact hole is completed to reach the underlying wiring layer 11.

A third embodiment of the present invention will next be described with reference to FIG. 3. In the third embodiment, a self-aligned contact (SAC) with a hole dimension of 0.20 µm diameter or width is formed in the resist mask. A shape before etching is shown in FIG. 3A.

Figure 3A:
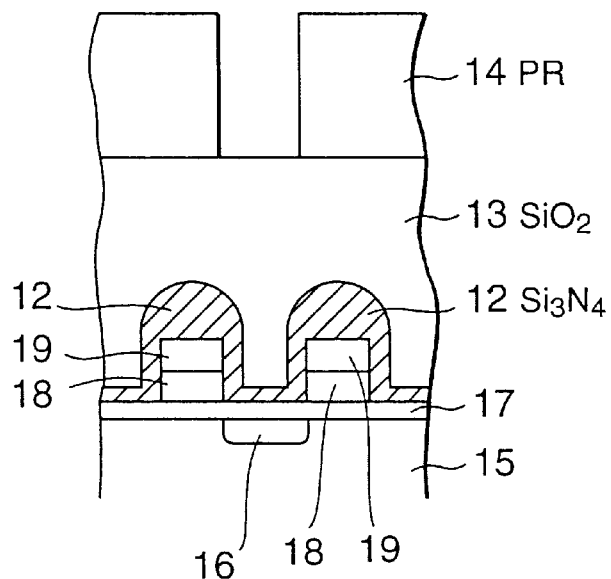
FIG. 3A is a sectional view before the plasma etching.

In FIG. 3A, a pair of gate electrodes is formed on a semiconductor substrate 15 via a gate insulating film 17, in which Poly-Si with a film thickness of 200 nm is formed as a lower film 18, and WSi with a film thickness of 200 nm is formed as an upper film 19. A source/drain area 16 is formed in a semiconductor substrate part between the gate electrodes.

The gate electrodes and the part between the gate electrodes are coated with $Si_3N_4$ 12 having a film thickness of 250 nm directly on the gate electrodes and about 50 nm on the side wall parts and on the part between the gate electrodes, and $SiO_2$ 13 is formed in a film thickness of 1200 nm. The photoresist mask 14 had a film thickness of 600 nm, and resolution to a diameter of 0.20 µm was achieved by KrF exposure.

The apparatus for use in the etching was the general parallel flat plate RIE apparatus, and conditions of the dry etching as the anisotropic etching were $C_4F_8/Ar/O_2/CH_2F_2/HI$=30/200/3/5/60 (sccm), pressure of 20 mTorr, and stage temperature of 20° C. The I/C ratio in these conditions is 0.48.

Figure 3B:
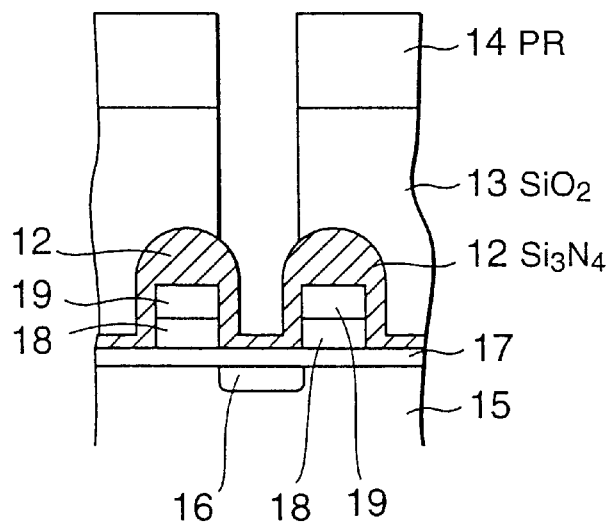
FIG. 3B is a sectional view after the plasma etching.

According to the present conditions, $SiO_2$ etching rate: 560 nm/min, and the $SiO_2$/PR selection ratio is 15. By setting the over etch amount to 50% with respect to the $SiO_2$ film thickness, the etching time was set. A schematic view of the etched shape is shown in FIG. 3B. A shave of $Si_3N_4$ in a gate electrode shoulder part was confirmed by about 10 nm. In this case, by setting a flow rate of HI to be added to 72 sccm, and setting the I/C ratio to 0.58, no shave amount of $Si_3N_4$ of the gate electrode shoulder part was confirmed.

For the gate shoulder part during SAC etching, since a sputter-efficiency is high and etching easily occurs by an ion physical action, a generation efficiency of an etching inhibitor needs to be raised. According to the experiment, by increasing the HI flow rate by at least 20% with respect to the S value of FIG. 1C, the $Si_3N_4$ etching could completely be inhibited. Additionally and thereafter, by removing $Si_3N_4$ and thin insulating film 17 on the source/drain area 16 by the dry etching using a three-element gas of $CHF_3/O_2/Ar$, the contact hole is completed to reach the source/drain area 16.

Additionally, in the aforementioned embodiments, the HI gas is illustrated as an iodine-containing gas, but a gas having a constitution of $C_xH_yI_z$ (x, y and z are positive integers) may also be used similarly.

Moreover, in the first and other embodiments, the gas containing iodine in a molecular is illustrated as the etching gas, but a gas containing chlorine or bromine in a molecular by $Cl_2$ gas, HCl gas, a gas having a constitution of $C_xH_yCl_z$ (x, y and z are positive integers), a gas having a constitution of $C_xCl_z$ (x, and z are positive integers), for example, $CCl_4$, a $Br_2$ gas, an HBr gas, or a gas having a constitution of $C_xH_yBr_z$ (x, y and z are positive integers) may also be used similarly as the etching gas. In this case, I/C of the abscissa of FIG. 1B changes to Cl (or Br)/C.

Moreover, $SiO_2$ has been illustrated as the insulating layer subjected to the dry etching, but a case in which the insulating layer subjected to the dry etching is SiOF is similar to the aforementioned embodiment. Furthermore, for the insulating layer to be subjected to the dry etching, organic SOG constituted only by attaching a methyl group or the like to silicon oxide of inorganic is substantially the same as silicon oxide of inorganic in an etching mechanism, and is therefore similar to the aforementioned embodiment. Additionally, examples of organic SOG include metyle silsesquioxane (MSQ), hydride organo siloxane polymer (HOSP), and the like.

Furthermore, in the embodiment, the etching was performed by the etching gas described in the embodiment of the present invention from the upper surface of the insulating layer 13 to reach $Si_3N_4$ film 12.

However, when it is difficult to establish both the etching of a deep contact hole and the selection property with $Si_3N_4$, another etching gas such as a four-element gas of $C_4F_8/CO/Ar/O_2$ containing none of iodine, chlorine and bromine is used in a former-half etching, and the etching gas of the present invention can be used in a latter-half etching in which the selection property with $Si_3N_4$ raises a problem.

As described above, by adding an iodine-containing gas (HI, or a gas having a constitution of $C_xH_yI_z$) as the etching gas of the insulating layer of $SiO_2$ or the like in such a manner that a ratio (I/C) of iodine to carbon in the etching gas is in a range of 0.3≦(I/C)≦1.5, and performing dry etching, an insulating layer etching of a substantially infinite selection ratio with respect to $Si_3N_4$ is possible. Here, even when instead of the iodine containing gas the gas containing chlorine or bromine as the same halogen element is used, the similar effect can be produced.

In the method of the present invention, iodine contained in the etching gas forms CNI as a low vapor pressure material on $Si_3N_4$, and therefore inhibits the etching of $Si_3N_4$ using as an etching stopper film. Moreover, when the chlorine or bromine containing gas is used, CNCl or CNBr, that is, a relatively low vapor pressure material is formed to inhibit the etching of $Si_3N_4$ using as an etching stopper film.

Moreover, when a CxHyFz gas used in recent years is added, $NH_3$ with a higher vapor pressure is generated, and it is therefore difficult to keep a high selection property with respect to $Si_3N_4$. However, even in this case, when the iodine containing gas is used, $NH_4I$ with a low vapor pressure is formed on $Si_3N_4$, and therefore inhibits the etching of $Si_3N_4$ using as an etching stopper film.

What is claimed is:

1. A dry etching method for forming a contact hole in an insulating layer using a silicon nitride film as an etching stopper, said method comprising steps of:

performing a first etching from the surface of said insulating layer to form an upper part of said contact hole under a first etching gas, said first etching gas containing none of iodine, chlorine and bromine; and subsequently performing a second etching until said silicon nitride film forms a lower part of said contact hole under a second etching gas, said second etching gas containing iodine, chlorine or bromine in a molecule, wherein a mixing ratio (I/C) of iodine to carbon in said second etching gas is 0.3 or more, and 1.5 or less.

2. A dry etching method according to claim 1, wherein said insulating layer is a silicon oxide layer, a fluorine-containing silicon oxide layer, or an organic SOG layer.

3. A dry etching method for forming a contact hole in an insulating layer using a silicon nitride film as an etching stopper, said method comprising steps of:

performing a first etching from the surface of said insulating layer to form an upper part of said contact hole under a first etching gas, said first etching gas containing none of iodine, chlorine and bromine; and subsequently performing a second etching until said silicon nitride film forms a lower part of said contact hole under a second etching gas, said second etching gas containing iodine, chlorine or bromine in a molecule, wherein a mixing ratio (Cl (or Br)/C) of chlorine or bromine to carbon in said second etching gas is 0.3 or more, and 1.5 or less.

4. A dry etching method according to claim 3, wherein said insulating layer is a silicon oxide layer, a fluorine-containing silicon oxide layer, or an organic SOG layer.

5. A method of manufacturing a semiconductor device comprising steps of:

forming a wiring layer on a semiconductor substrate via an insulator;

forming a silicon nitride film on said wiring layer;

forming an insulating layer on said silicon nitride film; and, forming a contact hole in said insulating layer by a dry etching method; wherein, said dry etching method comprising steps of:

performing a first etching from the surface of said insulating layer to form an upper part of said contact hole under a first etching gas, said first etching gas being free from iodine, chlorine and bromine; and subsequently performing a second etching until said silicon nitride film forms a lower part of said contact hole under a second etching gas, said second etching gas containing iodine, chlorine or bromine in a molecule, and a mixing ratio (I, Cl or Br)/C) of iodine, chlorine or bromine to carbon in said second etching gas is 0.3 or more, and 1.5 or less.

6. A method of manufacturing a semiconductor device comprising steps of:

forming a pair of gate electrodes on a semiconductor substrate via gate insulating films;

covering said gate electrodes and a space between said gate electrode structures with a silicon nitride film, continuously;

forming an insulating layer on said silicon nitride film; and, forming a contact hole in said insulating layer between said gate electrodes by a dry etching method using said silicon nitride film as an etching stopper; wherein, said dry etching method comprises steps of:

performing a first etching from the surface of said insulating layer to form an upper part of said contact hole under a first etching gas, said first etching gas being free from iodine, chlorine and bromine; and subsequently performing a second etching until said silicon nitride film forms a lower part of said contact hole under a second etching gas, said second etching gas containing iodine, chlorine or bromine in a molecule, and a mixing ratio (I, Cl or Br) IC) of iodine, chlorine or bromine to carbon in said second etching gas is 0.3 or more, and 1.5 or less.

* * * * *